United States Patent
Li et al.

(10) Patent No.: US 12,154,626 B2
(45) Date of Patent: *Nov. 26, 2024

(54) MEMORY DEVICE AND PROGRAMMING METHOD THEREOF

(71) Applicant: YANGTZE MEMORY TECHNOLOGIES CO., LTD., Wuhan (CN)

(72) Inventors: Haibo Li, Wuhan (CN); Chao Zhang, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/114,935

(22) Filed: Feb. 27, 2023

(65) Prior Publication Data

US 2023/0207015 A1    Jun. 29, 2023

Related U.S. Application Data

(63) Continuation of application No. 17/459,371, filed on Aug. 27, 2021, now Pat. No. 11,615,849, which is a continuation of application No. 16/923,100, filed on Jul. 8, 2020, now Pat. No. 11,139,029, which is a continuation of application No. PCT/CN2020/086332, filed on Apr. 23, 2020.

(51) Int. Cl.
| | |
|---|---|
| *G11C 16/10* | (2006.01) |
| *G11C 16/08* | (2006.01) |
| *G11C 16/24* | (2006.01) |
| *G11C 16/34* | (2006.01) |

(52) U.S. Cl.
CPC .............. *G11C 16/10* (2013.01); *G11C 16/08* (2013.01); *G11C 16/24* (2013.01); *G11C 16/3481* (2013.01)

(58) Field of Classification Search
CPC ......... G11C 16/10; G11C 16/08; G11C 16/24; G11C 16/3481
USPC ........................................ 365/185.22, 185.25
See application file for complete search history.

(56) References Cited

U.S. PATENT DOCUMENTS 4,415,889 A * 11/1983 Davis ..................... G09G 5/391
345/12
4,689,765 A * 8/1987 Hooper ................... G06F 9/382
712/E9.055

(Continued)

FOREIGN PATENT DOCUMENTS

| CN | 101147133 A | 3/2008 |
|---|---|---|
| CN | 101933095 A | 12/2010 |

(Continued)

*Primary Examiner* — Michael T Tran
(74) *Attorney, Agent, or Firm* — BAYES PLLC

(57) ABSTRACT

A memory device is provided. The memory device comprises a first plane and a second plane. The memory device further comprises a control circuit coupled to the first plane and the second plane. The control circuit is configured to: simultaneously initiate programming the first plane and the second plane; and in response to the first plane being successfully programmed, the second plane being unsuccessfully programmed, and a programming pulse count of the second plane being less than a predetermined programming pulse count value, keep programming the second plane and disable the first plane.

20 Claims, 6 Drawing Sheets

(56) References Cited

U.S. PATENT DOCUMENTS

| | | | | |
|---|---|---|---|---|
| 4,943,937 | A | * | 7/1990 | Kasano ............... G06T 1/60 345/550 |
| 5,018,145 | A | * | 5/1991 | Kikuchi ......... G01R 31/31921 714/743 |
| 5,146,211 | A | * | 9/1992 | Adams ............... G09G 5/08 345/545 |
| 7,983,065 | B2 | | 7/2011 | Samachisa |
| 8,068,365 | B2 | | 11/2011 | Kim |
| 8,180,994 | B2 | | 5/2012 | Sprouse |
| 8,625,376 | B2 | * | 1/2014 | Jung ............... G11C 7/1006 365/189.011 |
| 8,645,794 | B1 | | 2/2014 | Meir et al. |
| 8,824,207 | B2 | | 9/2014 | Kim |
| 9,093,132 | B2 | | 7/2015 | Kim |
| 9,230,689 | B2 | | 1/2016 | Tuers |
| 9,570,160 | B1 | * | 2/2017 | Shah ............... G11C 29/50004 |
| 9,595,343 | B1 | * | 3/2017 | Srinivasan ......... G11C 16/3459 |
| 9,596,343 | B2 | | 3/2017 | Srinivasan et al. |
| 9,720,609 | B1 | * | 8/2017 | Yan ............... G06F 3/0619 |
| 10,134,474 | B1 | * | 11/2018 | Chen ............... G06F 3/0679 |
| 10,153,046 | B1 | | 12/2018 | Agarwal et al. |
| 10,937,513 | B2 | * | 3/2021 | Ko ............... H10B 43/27 |
| 2005/0010717 | A1 | | 1/2005 | Ng et al. |
| 2005/0144358 | A1 | | 6/2005 | Conley et al. |
| 2006/0039196 | A1 | * | 2/2006 | Gorobets ............ G06F 11/106 714/E11.038 |
| 2007/0220234 | A1 | * | 9/2007 | Chang ............... G06F 15/167 712/34 |
| 2008/0304327 | A1 | * | 12/2008 | Elmhurst ......... G11C 16/3418 365/185.25 |
| 2009/0225600 | A1 | | 9/2009 | Park |
| 2009/0244983 | A1 | * | 10/2009 | Park ............... G11C 16/3427 365/185.11 |
| 2010/0329018 | A1 | | 1/2010 | Joo |
| 2010/0042774 | A1 | | 2/2010 | Yang et al. |
| 2010/0073814 | A1 | * | 3/2010 | Jubert ............... G11B 5/82 360/110 |
| 2010/0115376 | A1 | | 5/2010 | Shalvi et al. |
| 2010/0124107 | A1 | | 5/2010 | Yoon |
| 2010/0172185 | A1 | | 7/2010 | Kim |
| 2011/0109984 | A1 | * | 5/2011 | Jubert ............... G11B 5/02 |
| 2011/0235434 | A1 | | 9/2011 | Byom et al. |
| 2013/0141971 | A1 | * | 6/2013 | Hosono ............ G11C 16/10 365/185.02 |
| 2013/0163335 | A1 | | 6/2013 | Kim et al. |
| 2014/0269090 | A1 | * | 9/2014 | Flynn ............... G11C 16/3495 365/185.24 |
| 2015/0078086 | A1 | | 3/2015 | Lee |
| 2016/0078951 | A1 | | 3/2016 | Lin et al. |
| 2017/0052737 | A1 | * | 2/2017 | Tokiwa ............... G06F 12/0802 |
| 2017/0070241 | A1 | | 3/2017 | Kaku et al. |
| 2017/0116139 | A1 | | 4/2017 | McVay |
| 2017/0131904 | A1 | | 5/2017 | Rajwade et al. |
| 2017/0148514 | A1 | * | 5/2017 | Lee ............... G11C 13/0002 |
| 2017/0154656 | A1 | * | 6/2017 | Yeh ............... G11C 29/52 |
| 2017/0317693 | A1 | | 11/2017 | Yang et al. |
| 2018/0203774 | A1 | * | 7/2018 | Srinivasan ......... G11C 16/3459 |
| 2019/0057026 | A1 | | 2/2019 | Park |
| 2019/0096507 | A1 | | 3/2019 | Gaewsky et al. |
| 2019/0227719 | A1 | | 7/2019 | Park et al. |
| 2019/0259460 | A1 | | 8/2019 | Noro et al. |
| 2019/0347037 | A1 | * | 11/2019 | Chen ............... G06F 3/0673 |
| 2019/0347038 | A1 | | 11/2019 | Chen et al. |
| 2019/0348129 | A1 | * | 11/2019 | Chin ............... G11C 8/12 |
| 2020/0202958 | A1 | * | 6/2020 | Sugahara ......... G11C 16/08 |
| 2020/0293317 | A1 | * | 9/2020 | Kobayashi ......... G06F 9/30145 |
| 2021/0027847 | A1 | * | 1/2021 | Kang ............... G11C 16/10 |
| 2021/0042224 | A1 | * | 2/2021 | Chen ............... G06F 12/0607 |
| 2021/0064258 | A1 | * | 3/2021 | Sakurai ............ G06F 3/068 |
| 2021/0142859 | A1 | | 5/2021 | Lee |
| 2021/0158876 | A1 | | 5/2021 | Maejima et al. |
| 2021/0366555 | A1 | * | 11/2021 | Choi ............... G11C 16/30 |
| 2021/0391014 | A1 | * | 12/2021 | Li ............... G11C 16/24 |
| 2022/0336006 | A1 | * | 10/2022 | Huang ............ G11C 16/0483 |

FOREIGN PATENT DOCUMENTS

| | | | | |
|---|---|---|---|---|
| CN | 102449701 | A | | 5/2012 |
| CN | 102549672 | A | | 7/2012 |
| CN | 103137203 | A | | 6/2013 |
| CN | 103177764 | A | | 6/2013 |
| CN | 104714894 | B | * | 8/2017 |
| CN | 111356980 | A | | 6/2020 |
| JP | 2005135466 | A | | 5/2005 |
| JP | 2006-134476 | A | | 5/2006 |
| JP | 2008269775 | A | | 11/2008 |
| JP | 2022524728 | A | | 5/2022 |
| WO | 2006/065566 | A1 | | 6/2006 |
| WO | WO-2013017425 | A1 | * | 2/2013 ............ G01T 1/171 |
| WO | 2021163945 | A1 | | 8/2021 |

* cited by examiner

MEMORY DEVICE AND PROGRAMMING METHOD THEREOF

CROSS REFERENCE TO RELATED APPLICATIONS

This application is a continuation of U.S. application Ser. No. 17/459,371, filed on Aug. 27, 2021, which is a continuation of U.S. application Ser. No. 16/923,100, filed on Jul. 8, 2020, issued as U.S. Pat. No. 11,139,029, which is a continuation of International Application No. PCT/CN2020/086332, filed on Apr. 23, 2020, all of which are incorporated herein by reference in their entireties.

BACKGROUND

The present disclosure is related to a memory device and programming method thereof, and more particularly, to a memory device and programming method thereof for eliminating programming disturbance.

Recently, the field of semiconductor memory has received increased attention. Semiconductor memory may be volatile or nonvolatile. A nonvolatile semiconductor memory device can retain data even when not powered and therefore has been used extensively in cellular telephones, digital cameras, personal digital assistants, mobile computing devices, non-mobile computing devices and other devices.

A memory device may be classified into a single-plane type and a multi-plane type in accordance with structural configuration of memory arrays. The single-plane type memory device includes memory arrays arranged into a single plane, and the multi-plane type memory device includes memory arrays arranged into a plurality of planes. When programming the multi-plane type memory device, two or more planes may be programmed and verified simultaneously according to a multi-plane programming scheme to enhance programming efficiency. However, when the multi-plane type memory device contains defective planes (or degenerated planes), both the normal planes and the defective planes (or the degenerated planes) will be repeatedly programmed in an attempt to program data into the defective planes (or the degenerated planes), which decreases the programming speed, reduces the programming efficiency, and causes programming disturbance in the normal plane.

Therefore, there is a need to provide a memory device and its programming method that bypass certain planes such as the normal planes, such that the normal planes would not suffer from programming stress of unnecessary programming pulses.

SUMMARY

It is therefore an objective of the present disclosure to provide a memory device and related programming method to eliminate programming disturbance.

The present disclosure discloses a programming method for a memory device. The programming method comprises simultaneously starting to program a first plane and a second plane; and bypassing the first plane and keeping programming the second plane when the first plane has been programmed successfully and the second plane has not been programmed successfully yet.

The present disclosure further discloses a memory device. The memory device comprises a first plane, a second plane, and a control circuit. The control circuit is configured to control the first plane and the second plane according to a programming method. The programming method comprises simultaneously starting to program a first plane and a second plane; and bypassing the first plane and keeping programming the second plane when the first plane has been programmed successfully and the second plane has not been programmed successfully yet.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
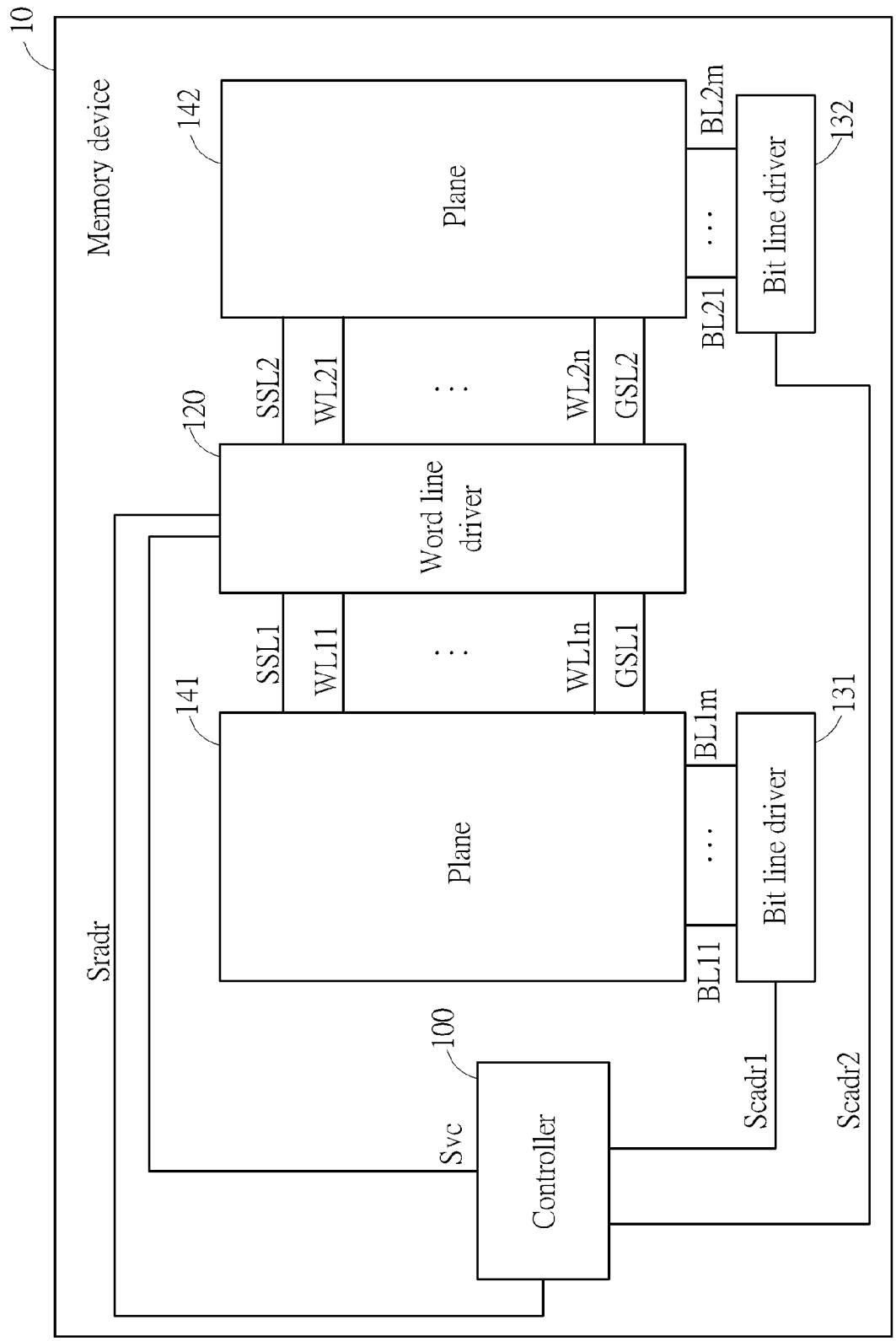
FIG. 1 is a block diagram of a memory device according to an embodiment of the present disclosure.

FIG. 1 is a block diagram of a memory device 10 according to an embodiment of the present disclosure. The memory device 10 may have a dual-plane structure, and may include a control circuit 100, a word line driver 120, a plurality of bit line drivers 131, 132 and a plurality of planes (also referred to memory planes) 141, 142.

Briefly, the planes 141, 142 may be programmed and verified simultaneously. When the plane 141 (also referred to as first plane) has been programmed successfully but the plane 142 has not been programmed successfully yet, the plane 141 may be bypassed and the plane 142 (also referred to as second plane) may be still being programmed. By bypassing the plane 141 from subsequent programming once the plane 141 passes all verification, it reduces the time spent in an attempt to apply unnecessary programming pulses to the plane 141, and eliminates programming disturbance in the plane 141.

Figure 2:
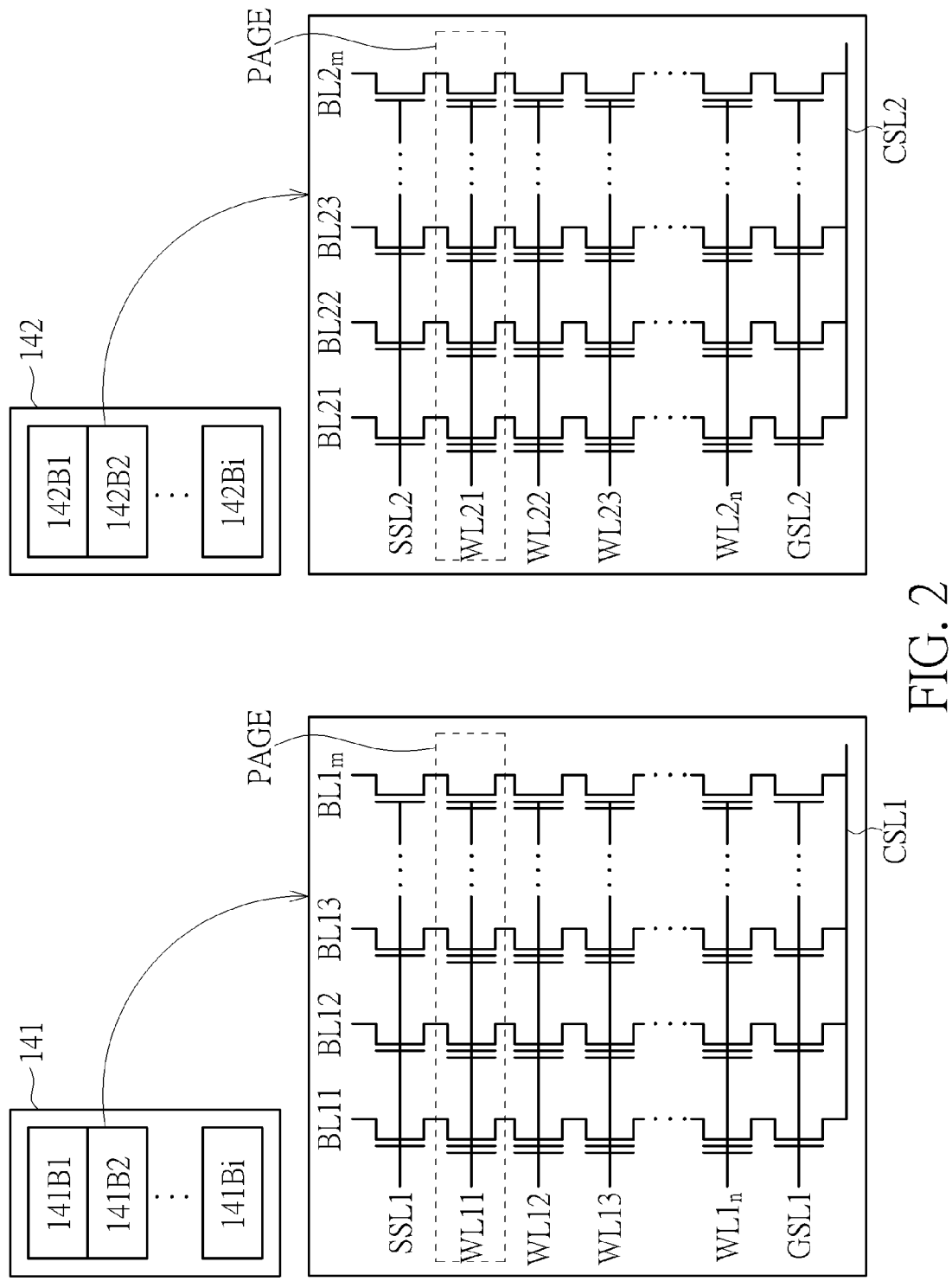
FIG. 2 is a schematic diagram of planes of the memory device shown in FIG. 1.

Please also refer to FIG. 2, which is a schematic diagram of the planes 141, 142 of the memory device 10 shown in FIG. 1. The plane 141 may be divided into a plurality of blocks 141B1 to 141Bi. Each of the blocks 141B1 to 141Bi includes a plurality of strings which may be NAND strings. Each string may include two select cells and a plurality of memory cells, which are connected in series, respectively, but is not limited thereto. The select cell disposed on a top of one string is configured for connecting the string to a plurality of bit lines BL11 to BL1$m$ and may be controlled by applying appropriate voltages to a string selection line SSL1. The select cell disposed at the bottom of one string is configured for connecting the string to a common source line CSL1 and may be controlled by applying appropriate voltages to a ground selection line GSL1. Control gates of the memory cells in the strings are connected to a plurality of word lines WL11 to WL1$n$, respectively.

Similarly, the plane 142 may be divided into a plurality of blocks 142B1 to 142Bi. Each of the blocks 142B1 to 142Bi includes a plurality of strings which may be NAND strings. Each string may include two select cells and a plurality of memory cells, which are connected in series, respectively, but is not limited thereto. The select cell disposed on a top of one string is configured for connecting the string to a plurality of bit lines BL21 to BL2$m$ and may be controlled by applying appropriate voltages to a string selection line SSL2. The select cell disposed at the bottom of one string is configured for connecting the string to a common source line CSL2 and may be controlled by applying appropriate voltages to a ground selection line GSL2. Control gates of the memory cells in the strings are connected to a plurality of word lines WL21 to WL2$n$, respectively.

As shown in FIG. 2, the planes 141, 142 have an identical structure (or a mirrored structure). While the dual-plane structure is used in the embodiment, it should be appreciated that other numbers of planes may also be adopted within the scope of the present disclosure. Moreover, either a 2-dimensional planer memory structure, a 3-dimensional stacked structure, a NAND flash memory structure and/or a NOR flash memory structure may be implemented in the planes 141, 142. Each of the blocks 141B1 to 141Bi and 142B1 to 142Bi may be divided into a plurality of pages as indicated by dashed lines. In some embodiments, a block is the unit of conventional erase and a page is the unit of conventional program. However, other units of erase/program may be used as well. Typically, the bit lines BL11 to BL1$m$ or BL21 to BL2$m$ run on the top of the strings in a direction perpendicular to the word lines WL11 to WL1$n$ or WL21 to WL2$n$, respectively, wherein i, m and n are integers larger than 1, but is not limited thereto.

Those skilled in the art would appreciate that the number of memory cells in one string does not limit the scope of the present disclosure. In addition, the memory cells in the strings may be floating-gate transistors or charge-trapping transistors. Each memory cell may store 1-bit data or two or more bits of data, and thus may be of a single-level cell (SLC) type, a multi-level cell (MLC) type, a triple-level cell (TLC) type, a quad-level cell (QLC) type, or a higher-level type. Each memory cell may hold one of Q possible programming states, where Q is a positive integer equal to or greater than 2, generally with Q=2 for an SLC, Q=4 for an MLC, Q=8 for a TLC, and Q=16 for a QLC.

The control circuit 100 may be coupled to the word line driver 120 and the bit line drivers 131, 132. The word line driver 120 may be coupled to the plane 141 via the string selection line SSL1, the word lines WL11 to WL and the ground selection line GSL1. The word line driver 120 may be coupled to the plane 142 via the string selection line SSL2, the word lines WL21 to WL2$n$ and the ground selection line GSL2. The bit line driver 131 may be coupled to the plane 141 via the bit lines BL11 to BL1$m$. The bit line driver 132 may be coupled to the plane 142 via bit lines BL21 to BL2$m$. The array of memory cells in the plane 141 may be addressed by the word lines WL11 to WL1$n$ and the bit lines BL11 to BL1$m$, and the array of memory cells in the plane 142 may be addressed by the word lines WL21 to WL2$n$ and the bit lines BL21 to BL2$m$.

The control circuit 100 may be a controller, an embedded microprocessor, a microcontroller, or the like. The control circuit 100 may communicate with an external host to receive data for storage in the planes 141, 142 and to transmit data fetched from the planes 141, 142. The control circuit 100 may receive commands, addresses or data from the external host and generate bit line address signals Scadr1, Scadr2, and a word line address signal Sradr. The word line driver 120 may operate in response to the word line address signal Sradr from the control circuit 100 to select word lines for the read, program, erasure and verification operations. The bit line drivers 131, 132 may operate in response to the bit line address signals Scadr1, Scadr2 from the control circuit 100 to generate bit line signals to select bit lines for the read, program, erasure and verification operations. In some embodiments, the control circuit 100 includes voltage reference circuits for providing voltages for read, program, erasure and verification operations, and the bit line drivers 131, 132 and the word line driver 120 include switches for selecting a voltage. In other embodiments, the bit line drivers 131, 132 and the word line driver 120 include voltage generation circuitry and the control circuit 100 provides digital control information to instruct the bit line drivers 131, 132 and the word line driver 120 to drive various voltages on the bit lines BL11 to BL1$m$, BL21 to BL2$m$ and the word lines WL11 to WL1$n$, WL21 to WL2$n$. However, the manner in which voltages are generated or routed to the bit lines BL11 to BL1$m$, BL21 to BL2$m$ and the word lines WL11 to WL1$n$, WL21 to WL2$n$ does not limit the scope of the present disclosure.

Figure 3:
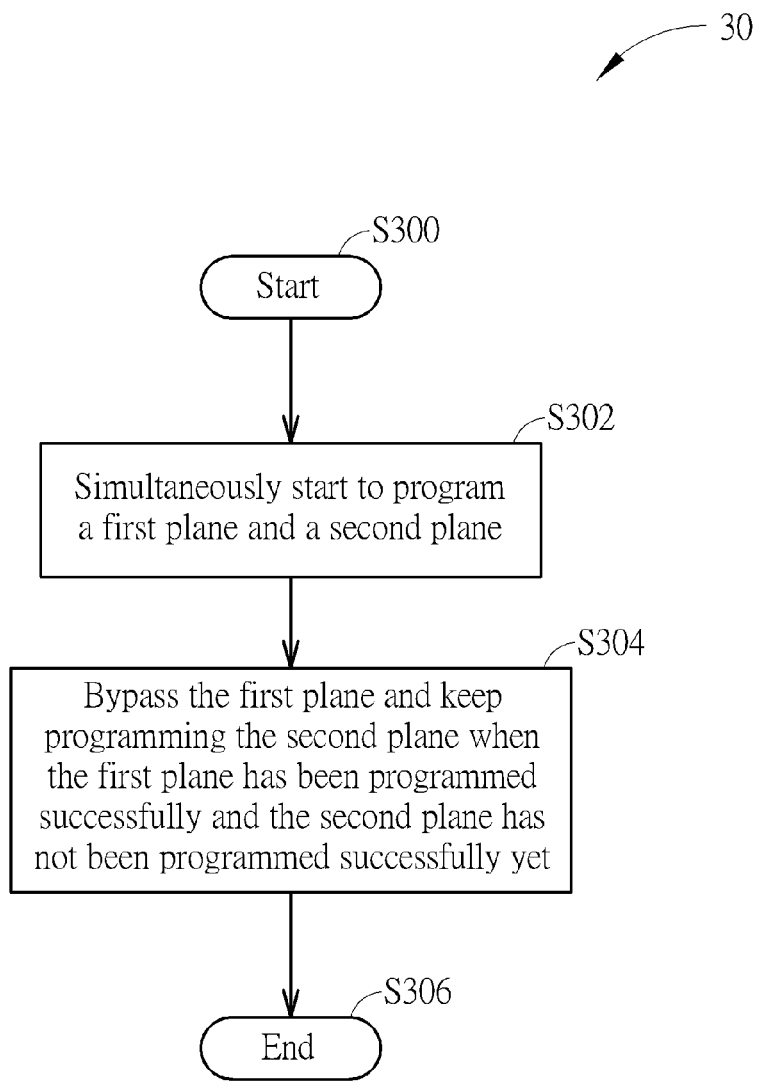
FIG. 3 is a flowchart of a programming method to program the memory device shown in FIG. 1 according to an embodiment of the present disclosure.

FIG. 3 is a flowchart of a programming method 30 to program the memory device 10 shown in FIG. 1 according to an embodiment of the present disclosure. The programming method 30 may be compiled into a program code. The method 30 may be performed by the control circuit 100, and include following steps:

Step S300: Start.

Step S302: Simultaneously start to program a first plane and a second plane.

Step S304: Bypass the first plane and keep programming the second plane when the first plane has been programmed successfully and the second plane has not been programmed successfully yet.

Step S306: End.

In step S302, the control circuit 100 simultaneously start to program two planes (for example, the planes 141, 142) or more than two planes of the memory device 10 so as to achieve multi-plane programming scheme in which two or more planes may be programmed and verified simultaneously. However, in step S302, the plane 141 is bypassed and the plane 142 is still being programmed when the plane 141 has been programmed successfully but the plane 142 has not been programmed successfully yet. By bypassing the plane 141 once the plane 141 pass all verification, programming disturbance may be eliminated.

Figure 4:
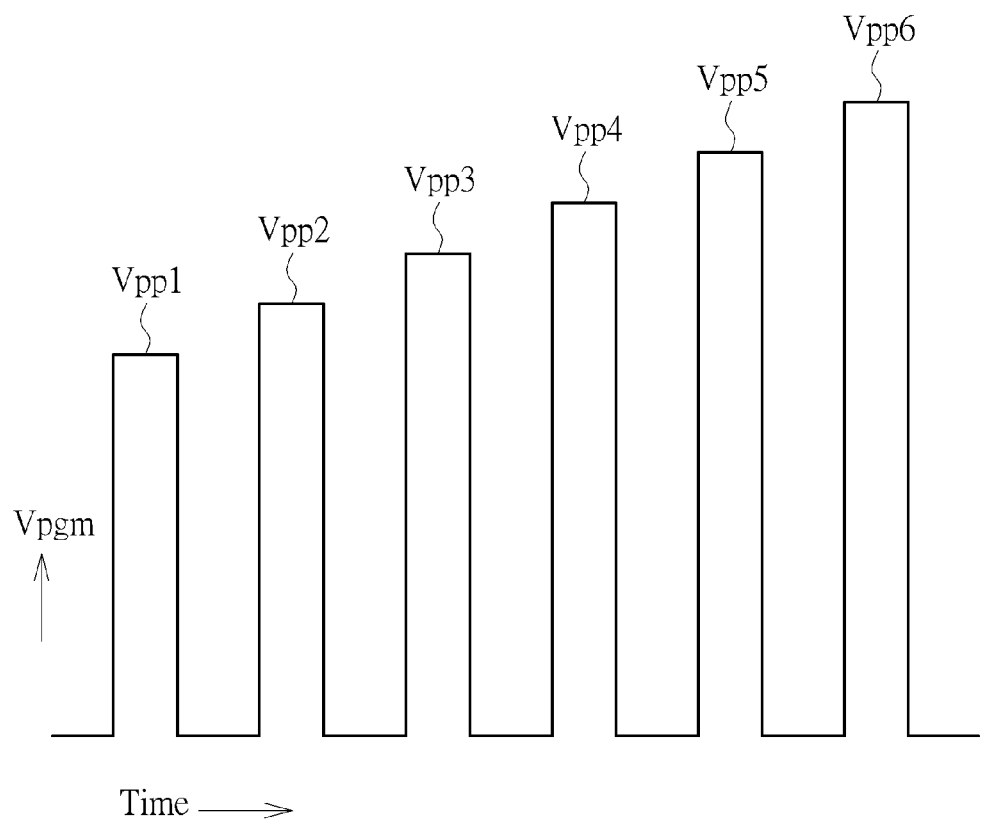
FIG. 4 is a schematic diagram illustrating a waveform of a programming voltage according to an embodiment of the present disclosure.

For instance, the control circuit 100 may adopt an incremental step pulse programming (ISPP) scheme to program the planes 141, 142. Please refer to FIG. 4, which is a schematic diagram illustrating a waveform of a programming voltage according to an embodiment of the present disclosure. A plurality of programming pulses Vpp1 to Vpp6 may be applied to blocks at an increasing magnitude, and each successive programming pulse (for example, the programming pulse Vpp2) may exceed the immediately previous programming pulse (for example, the programming pulse Vpp1) by a programming step size. The programming step size may vary according to programming states or other requirements. The programming pulse Vpp1 may be applied to both the planes 141, 142 to start programming the planes 141, 142 simultaneously. On the other hand, if the block 141B1 has been programmed successfully before the programming pulse Vpp5 is applied, the block 141B1 may be subject to merely the programming pulses Vpp1 to Vpp4 but bypass the following programming pulses Vpp5, Vpp6.

Consequently, the block 141B1 would not suffer from programming stress of the following unnecessary programming pulses Vpp5, Vpp6 while the block 142B1 are required to be programmed by more programming pulses (namely, the programming pulses Vpp5, Vpp6) and for longer time (because the number of programming pulses is larger), thereby eliminating or at least reducing programming disturbance in the block 141B1.

The block 141B1 may be programmed up to a first programming pulse count (equal to 4) corresponding to the programming pulses Vpp1 to Vpp4, and The block 142B1 may be programmed up to a second programming pulse count (equal to 6) corresponding to the programming pulses Vpp1 to Vpp6. The first programming pulse count is less than the second programming pulse counts. The block 142B1 may be programmed until a maximum programming pulse count Cpmax (also referred to as a predetermined programming pulse count) (for example, equal to 6) is reached. If the block 142B1 is still programmed unsuccessfully, the block 142B1 may be identified as a defective block. As the programming pulse Vpp6 is the last programming pulse corresponding to the maximum programming pulse count Cpmax, the control circuit 100 may stop programming the block 142B1. Although the control circuit 100 ends the programming of the (unsuccessfully-programmed or successfully-programmed) blocks 141B1, 142B1 non-simultaneously, the control circuit 100 start to program (first memory cells of) the block 141B2 followed by (third memory cells of) the block 141B1 and (second memory cells of) the block 142B2 followed by (fourth memory cells of) the block 142B2 simultaneously. A length of time from the start of programming the block 141B1 to the start of programming the block 141B2 depends on a length of time from the start of programming the block 142B1 to the start of programming the block 142B2. In other words, a length of time to programming two blocks (for example, the blocks 141B1, 142B1) is determined based on the block of a larger programming pulse count, which may be a defective block or a degenerated block, instead of the block of a smaller programming pulse count, which may be a normal block.

Figure 5:
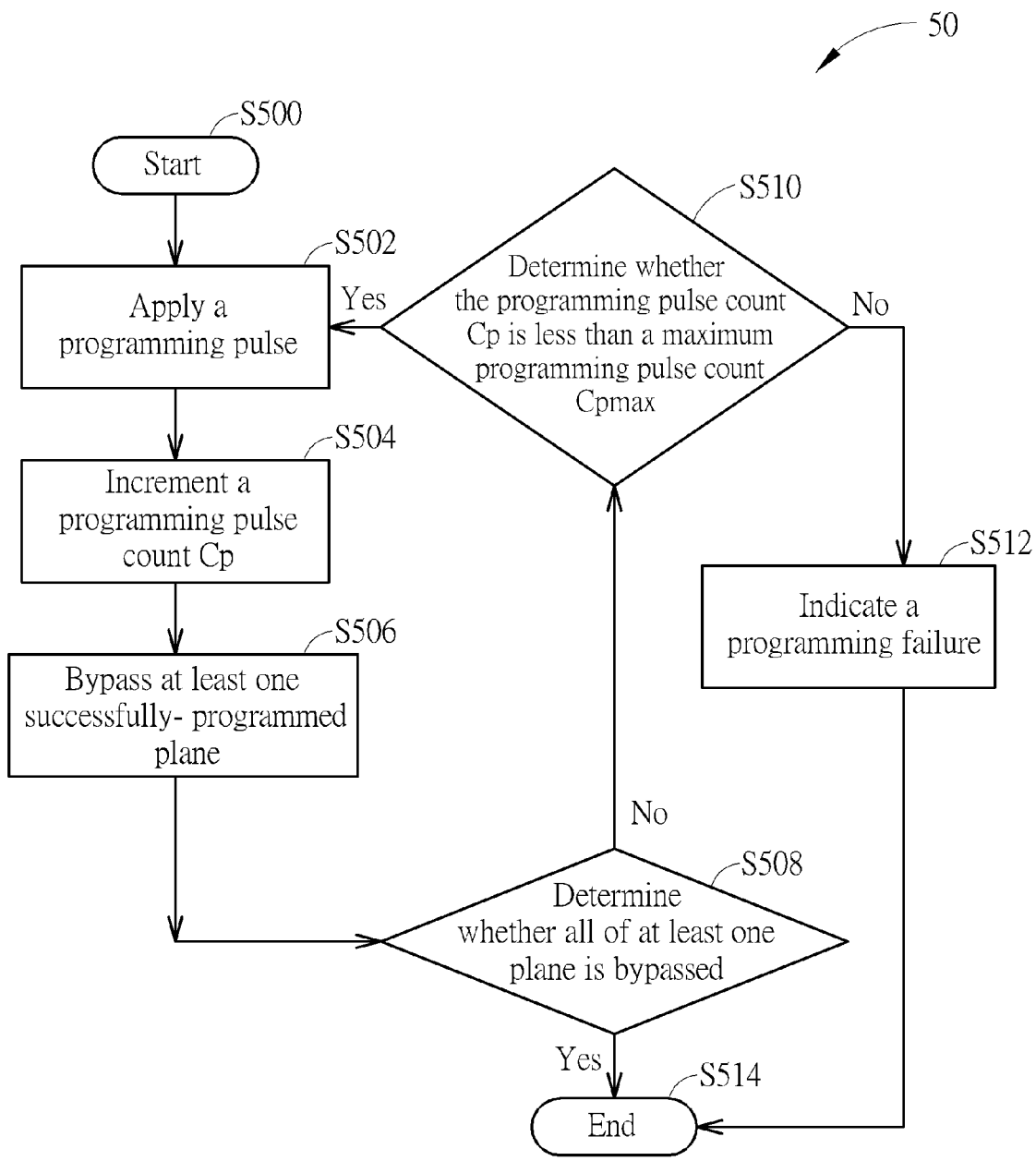
FIG. 5 is a flowchart of a programming method to program the memory device shown in FIG. 1 according to an embodiment of the present disclosure.

FIG. 5 is a flowchart of a programming method 50 to program the memory device 10 shown in FIG. 1 according to an embodiment of the present disclosure. The programming method 50 may be compiled into a program code. The method 50 may be performed by the control circuit 100, and include following steps:

Step S500: Start.
Step S502: Apply a programming pulse.
Step S504: Increase a programming pulse count Cp.
Step S506: Bypass at least one successfully-programmed plane.
Step S508: Determine whether all planes are bypassed. If yes, go to step S514; otherwise, go to step S510.
Step S510: Determine whether the programming pulse count Cp is less than the maximum programming pulse count Cpmax. If yes, go to step S502; otherwise, go to step S512.
Step S512: Indicate a programming failure.
Step S514: End.

Upon startup of a multi-plane programming, the planes 141, 142 are initialized for programming in step S500. The control circuit 100 sets a programming pulse count Cp and a verification count Cvf to a value such as 0 (namely, Cp=0, Cvf=0). In step S502, the control circuit 100 simultaneously starts to program the first memory cells of (the block 141B1 or a page of) the plane 141 and the second memory cells of (the block 142B1 or a page of) the second plane 142. The word line driver 120 may apply a programming pulse (for example, the programming pulse Vpp1) to selected word lines of the planes 141, 142. In step S504, the control circuit 100 increments the programming pulse count Cp by 1 (Cp=1).

Then, the control circuit 100 may verify whether the first memory cells of the plane 141 and the second memory cells or the plane 142 have been programmed successfully. In some embodiment, verify pulse(s) may be applied after each program pulse shown in FIG. 4 for verifying the threshold voltage of each memory cell. In some embodiment, the control circuit 100 may verify if the first memory cells and the second memory cells have reached one or more programming state(s). In some embodiment, data may be read from the first memory cells and the second memory cells on the selected bit lines, respectively. If data read is incorrect, the control circuit 100 may verify the respective first memory cells or the respective second memory cells as failed. If data read is correct, the control circuit 100 may verify the respective first memory cells or the respective second memory cells cell as passed. After the verification of the first memory cells and the second memory cells, the control circuit 100 increments the verification count Cvf by 1 (Cvf=1). In some embodiments, if more than a respective preset number of the first memory cells or the second memory cells have failed to reach one of the programming states, the control circuit 100 will verify the first memory cells or the second memory cells as failed. If less than a respective preset number of the first memory cells or the second memory cells have failed to reach the programming state(s), the control circuit 100 will verify the planes 141, 142 as passed. In some embodiments, if a number of the first memory cells or the second memory cells unable to be programmed successfully for each of the programming state(s) is less than a respective preset number, the first memory cells or the second memory cells are determined as passed.

To reduce programming disturbance, if any plane has been programmed successfully (and verified as passed), the control circuit 100 in step S506 bypasses the (successfully-programmed) plane(s) in the following programming. However, the control circuit 100 continues programming the other plane(s), which has yet to be programmed successfully in step S506. The control circuit 100 sets a suspension signal Sss1 to a logical low while maintaining a main signal Smn to the logical high to bypass the plane 141 and to continue the programming or the plane 142. By suspending the plane 141 once the plane 141 pass all verification, programming disturbance may be eliminated. In some embodiments, the plane 141 is suspended and the plane 142 are still being programmed when less than the preset number of the first memory cells has not been verified as passed yet but more than the preset number of the second memory cells has been verified as failed. The first memory cells of the plane 141 will be bypassed and preserved in the subsequent programming, while the second memory cells of the plane 142 will still be programmed in the subsequent programming. In other words, a first programming process for the first memory cells of the plane 141 and a second programming process for the second memory cells of the plane 142 are initiated simultaneously but end non-simultaneously. By suspending the plane 141 when the first memory cells of plane 141 are bypassed, programming disturbance in the plane 141 may be eliminated.

In step S508, the control circuit 100 determines whether all of the planes 141, 142 for the multi-plane programming scheme are bypassed. If all of the planes 141, 142 have been bypassed, the multi-plane programming scheme is completed. If any of the planes 141, 142 have not been suspended yet, the control circuit 100 determines whether the programming pulse count Cp is less than the maximum programming pulse count Cpmax in step S510. If the programming pulse count Cp (for example, Cp=1) is less than the maximum programming pulse count Cpmax (for example, Cpmax=6), the control circuit 100 iterates over Steps S402 to S408 until the programming pulse count Cp reaches the maximum programming pulse count Cpmax. For example, another programming pulse (for example, the programming pulse Vpp2, Vpp3, . . . , or Vpp6 in sequence) is applied to the selected word lines of the non-bypassed plane(s) in Step S502, and the control circuit 100 increments the programming pulse count Cp by 1 again in step S504.

If the first memory cells of the plain 141 is bypassed after the programming pulse Vpp4 is applied, the programming pulse count Cp increases to 4 to serve as a first programming pulse count. Besides, the verification count Cvf may be not less than 4 to serve as a first number of times for the first memory cells to be verified. Similarly, if the second memory cells of the plain 142 is bypassed after the programming pulse Vpp6 is applied, the programming pulse count Cp increases to 6 to serve as a second programming pulse count. Alternatively, if the second memory cells of the plain 142 cannot be successfully programmed (and may thus be disabled) after the last programming pulse (namely, the programming pulse Vpp6) is applied, the programming pulse count Cp also increases to 6, which is equal to the maximum programming pulse count Cpmax. In these cases, the verification count Cvf may be not less than 6 to serve as a second number of times for the second memory cells to be verified. The first programming pulse count corresponding to the first memory cells is less than the second programming pulse counts corresponding to the second memory cells. The first number of times for the first memory cells to be verified is less than the second number of times for the second memory cells to be verified.

Since the first memory cells has been programmed successfully before the programming pulse Vpp5 is applied, the first memory cells may be subject to merely the programming pulses Vpp1 to Vpp4 but bypass the following programming pulses Vpp5, Vpp6. Consequently, the first memory cells would not suffer from programming stress of the following programming pulses Vpp5, Vpp6 while the second memory cells are required to be programmed by more programming pulses Vpp5, Vpp6 for longer time, thereby eliminating or at least reducing programming disturbance in the block 141B1.

If the programming pulse count Cp (or the second programming pulse count) is equal to or larger than the maximum programming pulse count Cpmax, a programming failure report is transmitted to the control circuit 100 in step S512 so as to report a programming failure for non-bypassed plane(s) (for example, the plane 142) if there is any. In other words, the second memory cells may be programmed until the maximum programming pulse count Cpmax is reached. In some embodiments, when the programming pulse count Cp (or the second programming pulse count) is equal to the maximum programming pulse count Cpmax, the control circuit 100 may stop programming the second memory cells.

Figure 6:
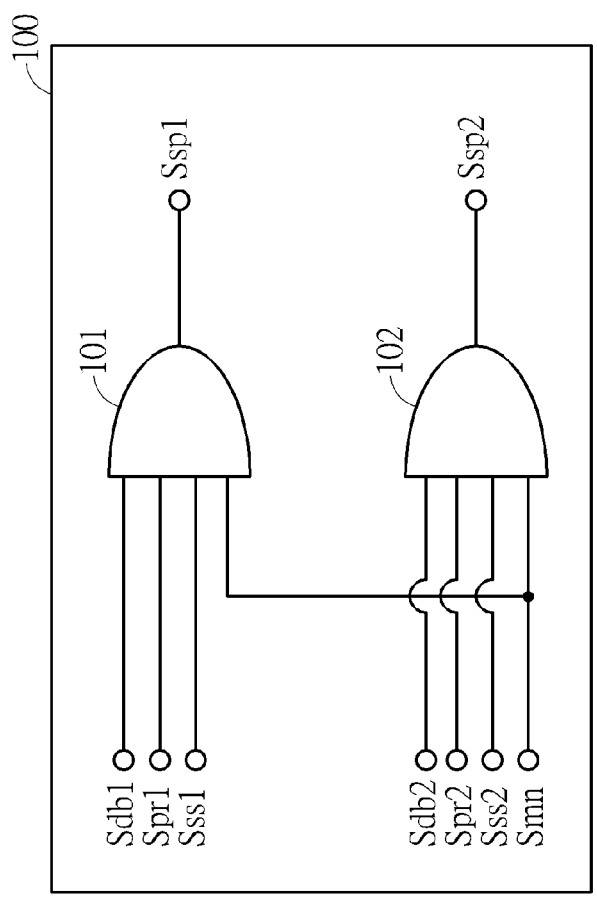
FIG. 6 is a schematic diagram of a selected circuit in the control circuit shown in FIG. 1 according to an embodiment of the present disclosure.

It is noteworthy that those skilled in the art may readily make different alternations and modifications. For instance, to bypass (the first memory cells of) the plane 141, a plane selection signal or a block selection signal may be blocked. Alternatively, all the word lines WL21 to WL2n or all the bit lines BL11 to BL1m of the plane 141 is deselected to bypass (the first memory cells of) the plane 141. FIG. 6 is a schematic diagram of a selected circuit in the control circuit 100 shown in FIG. 1 according to an embodiment of the present disclosure. The control circuit 100 may include AND gates 101 and 102 to control access to the planes 141 and 142, respectively. The AND gate 101 may receive a plane address signal Spr1, a disable signal Sdb1, the main signal Smn, or the suspension signal Sss1 to generate a plane selection signal Ssp1. The AND gate 102 may receive a plane address signal Spr2, a disable signal Sdb2, the main signal Smn, or a suspension signal Sss2 to generate a plane selection signal Ssp2. In some embodiments, the control circuit 100 may set the main signal Smn to a logical high to continue programming of the memory device 10, and set the main signal Smn to a logical low to cease programming of the memory device 10. In some embodiments, the control circuit 100 may generate the disable signal Sdb1, Sdb2 when a programming failure report, which may indicate a programming result upon exiting program-verification operation(s), is received. In some embodiments, the suspension signals Sss1, Sss2 may indicate whether verification result(s) are passed or failed.

In some embodiments, the disable signal Sdb1, Sdb2 may be associated with a programming state counter, the verification count Cvf, the programming pulse count Cp, or the maximum programming pulse count Cpmax. The maximum programming pulse count Cpmax may define the maximum number of times to apply programming pulses to the planes 141, 142. The programming state counter may be associated with target programming states or current programming states. Specifically, the first memory cells and the second memory cells may be initially set in the erase state, and later, a series of program-verification operations may be performed on the first memory cells and the second memory cells to program the first memory cells and the second memory cells into respective target programming states. The series of program-verification operations may start from the lowest programming state and proceed to higher programming states until the threshold voltages of selected memory cells reach respective verification voltage levels of respective target programming states. In some embodiments, the verification voltages may be selected as the minimum threshold voltages of threshold voltage distribution curves of the programming states, respectively. Each program-verification operation may include a programming operation and a subsequent verification operation.

The control circuit 100 may generate the bit line address signal Scadr1 according to the plane selection signal Ssp1, generate the bit line address signal Scadr2 according to the plane selection signal Ssp2, and generate the word line address signal Sradr according to the plane selection signals Ssp1, Ssp2. In some embodiments, when it is determined to suspend the plane 141, the control circuit 100 may set the suspension signal Sss1 a logical low, the AND gate 101 may block the plane selection signal Ssp1 in response to the suspension signal Sss1 by setting the plane selection signal Ssp1 to a logical low, and the control circuit 100 may generate the word line address signal Sradr and the bit line address signal Scadr1 to deselect the word lines WL11 to WL1n and the bit lines BL11 to BL1m of the plane 141. Likewise, when it is determined to suspend the plane 142, the control circuit 100 may set the suspension signal Sss2 to a logical low, the AND gate 102 may block the plane selection signal Ssp2 in response to the suspension signal Sss2 by setting the plane selection signal Ssp2 to a logical low, and the control circuit 100 may generate the word line address signal Sradr and the bit line address signal Scadr2 to deselect the word lines WL21 to WL2n and the bit lines BL21 to BL2m of the plane 142. For instance, the word lines WL11 to WL1n, WL21 to WL2n or the bit lines BL11 to BL1m, BL21 to BL2m may be put in a floating state, be subjected to a low voltage, or be grounded so as to deselect the word lines WL11 to WL1n, WL21 to WL2n or the bit lines BL11 to BL1m, BL21 to BL2m.

In some embodiments, the AND gate 101 may receive a first block address signal in place of the plane address signal Spr1 to generate a first block selection signal (to replace the plane selection signal Ssp1), and the AND gate 102 may receive a second block address signal in place of the plane address signal Spr2 to generate a second block selection signal (to replace the plane selection signal Ssp2). The control circuit 100 may generate the bit line address signal Scadr1 according to the first block selection signal, generate the bit line address signal Scadr2 according to the second block selection signal, and generate the word line address signal Sradr according to the first block selection signal and the second block selection signal. In some embodiments, when it is determined to suspend the block 141B1, the control circuit 100 may set the suspension signal Sss1 to a logical low, the AND gate 101 may block the first block selection signal in response to the suspension signal Sss1 by setting the first block selection signal to a logical low, and the control circuit 100 may generate the word line address signal Sradr and the bit line address signal Scadr1 to deselect the word lines WL11 to WL1n and the bit lines BL11 to BL1m of the plane 141. Likewise, when it is determined to suspend the block 142B1, the control circuit 100 may set the suspension signal Sss2 to a logical low, the AND gate 102 may block the second block selection signal in response to the suspension signal Sss2 by setting the second block selection signal to a logical low, and the control circuit 100 may generate the word line address signal Sradr and the bit line address signal Scadr2 to deselect the word lines WL21 to WL2n and the bit lines BL21 to BL2m of the plane 142.

In summary, the present disclosure simultaneously programs at least two planes of a memory device so as to achieve the multi-plane programming scheme. At least one plane is bypassed, and the other plane(s) are still being programmed when the at least one plane has been programmed successfully but the other plane(s) have not been programmed successfully yet. By bypassing the at least one plane once the at least one plane passes all verification, programming disturbance in the at least one plane may be eliminated.

Those skilled in the art will readily observe that numerous modifications and alterations of the device and method may be made while retaining the teachings of the present disclosure. Accordingly, the above disclosure should be construed as limited only by the metes and bounds of the appended claims.

What is claimed is:

1. A memory device, comprising:
a first plane controlled by a first AND gate;
a second plane controlled by a second AND gate; and
a control circuit coupled to the first plane and the second plane, and configured to:
simultaneously initiate programming the first plane and the second plane by sending a main signal to the first AND gate and the second AND gate,
in response to the first plane being successfully programmed and the second plane being unsuccessfully programmed, determine whether a programming pulse count of the second plane being less than a predetermined programming pulse count value, and in response to determine that the programming pulse count of the second plane being less than the predetermined programming pulse count value, keep programming the second plane and disable the first plane by sending a second suspension signal to the second AND gate and maintaining the main signal.

2. The memory device of claim 1, wherein control circuit is further configured to:
in response to the first plane being successfully programmed, disable the first plane; and
in response to the first plane being disabled, the second plane being unsuccessfully programmed, and the programming pulse count of the second plane being less than the predetermined programming pulse count value, keep programming the second plane.

3. The memory device of claim 2, wherein to disable the first plane, the control circuit is further configured to perform at least one of:
blocking a plane selection signal associated with the first plane;
blocking a block selection signal associated with the first plane;
deselecting all word lines of the first plane; or
deselecting all bit lines of the first plane.

4. The memory device of claim 2, wherein the control circuit is further configured to:
in response to the first plane being successfully programmed, disable the first plane; and
in response to the programming pulse count of the second plane being equal to or larger than the predetermined programming pulse count value, disable the second plane.

5. The memory device of claim 1, wherein the control circuit is further configured to:
apply a programming pulse to at least a first word line coupled to one or more first memory cells of the first plane and at least a second word line coupled to one or more second memory cells of the second plane; and
increase a programming pulse count of the first plane and the programming pulse count of the second plane.

6. The memory device of claim 5, wherein the control circuit is further configured to:
in response to a first number of the first memory cells not programmed successfully being less than a preset number, and a second number of the second memory cells not programmed successfully being more than the preset number, determine that the first plane being successfully programmed and the second plane being unsuccessfully programmed.

7. The memory device of claim 2, wherein to keep programming the second plane and disable the first plane, the control circuit is further configured to:
adjust a programming control signal of the first plane; and
maintain a main signal of the first plane and the second plane.

8. The memory device of claim 6, wherein the control circuit is further configured to:
apply a next programming pulse to the second plane; and
increase the programming pulse count of the second plane.

9. The memory device of claim 4, wherein the control circuit is further configured to:
in response to the programming pulse count of the second plane being equal to or larger than the predetermined programming pulse count value, adjust a programming status signal of the second plane to indicate a programming failure of the second plane.

10. The memory device of claim 5, wherein the control circuit is further configured to:
   verify whether the first memory cells and the second memory cells are programmed successfully, wherein a third number of times for the first memory cells to be verified is less than a fourth number of times for the second memory cells to be verified.

11. A method for programming a memory device, comprising:
   simultaneously initiating programming a first plane and a second plane of the memory device by sending a main signal to a first AND gate controlling the first plane and a second AND gate controlling the second plane;
   in response to the first plane being successfully programmed and the second plane being unsuccessfully programmed, determining whether a programming pulse count of the second plane being less than a predetermined programming pulse count value; and
   in response to determine that the programming pulse count of the second plane being less than the predetermined programming pulse count value, keeping programming the second plane and disabling the first plane by sending a second suspension signal to the second AND gate and maintaining the main signal.

12. The method of claim 11, wherein keeping programming the second plane and disabling the first plane comprises:
   in response to the first plane being successfully programmed, disabling the first plane; and
   in response to the first plane being disabled, the second plane being unsuccessfully programmed, and the programming pulse count of the second plane being less than the predetermined programming pulse count value, keeping programming the second plane.

13. The method of claim 12, wherein disabling the first plane comprises at least one of:
   blocking a plane selection signal associated with the first plane;
   blocking a block selection signal associated with the first plane;
   deselecting all word lines of the first plane; or
   deselecting all bit lines of the first plane.

14. The method of claim 12, further comprising:
   in response to the second plane being successfully programmed, disabling the first plane; and
   in response to the programming pulse count of the second plane being equal to or larger than the predetermined programming pulse count value, disabling the second plane.

15. The method of claim 11, further comprising:
   applying a programming pulse to at least a first word line coupled to one or more first memory cells of the first plane and at least a second word line coupled to one or more second memory cells of the second plane; and
   increasing a programming pulse count of the first plane and the programming pulse count of the second plane.

16. The method of claim 15, wherein determining that the first plane being successfully programmed and the second plane being unsuccessfully programmed comprises:
   in response to a first number of the first memory cells not programmed successfully being less than a preset number, and a second number of the second memory cells not programmed successfully being more than the preset number, determining that the first plane being successfully programmed and the second plane being unsuccessfully programmed.

17. The method of claim 16, wherein keeping programming the second plane and disabling the first plane comprises:
   adjusting a programming control signal of the first plane; and
   maintaining a main signal of the first plane and the second plane.

18. The method of claim 16, wherein keeping programming the second plane further comprises:
   applying a next programming pulse to the second plane; and
   increasing the programming pulse count of the second plane.

19. The method of claim 14, further comprising:
   in response to the programming pulse count of the second plane being equal to or larger than the predetermined programming pulse count value, adjusting a programming status signal of the second plane to indicate a programming failure of the second plane.

20. The method of claim 15, further comprising:
   verifying whether the first memory cells and the second memory cells are programmed successfully, wherein a third number of times for the first memory cells to be verified is less than a fourth number of times for the second memory cells to be verified.

* * * * *